Nov. 7, 1967 W. H. SWAIN 3,351,871
ELECTRICAL OSCILLATOR WITH HYSTERESIS AND DELAY ELEMENTS
Filed June 10, 1965

INVENTOR.
WILLIAM H. SWAIN

United States Patent Office 3,351,871

Patented Nov. 7, 1967

3,351,871

ELECTRICAL OSCILLATOR WITH HYSTERESIS AND DELAY ELEMENTS

William H. Swain, Sarasota, Fla., assignor of one-third to Walter J. Kreske, Newton Centre, Massachusetts Filed June 10, 1965, Ser. No. 462,819
17 Claims. (Cl. 331—111)

This invention relates to oscillators incorporating hysteresis and delay elements, and to improved hysteresis and delay elements having greater utility when used in an electrical oscillator or when used to condition signals. The oscillators, hysteresis elements, and delay elements described in detail are electrical, but the same principles may be used to construct mechanical, electromechanical, hydraulic, or pneumatic elements. The term hysteresis as herein used means an effect in which the magnitude of a resulting quantity is different during increases in the magnitude of the cause than during decreases.

In accordance with the usual prior art practice an oscillator is constructed by connecting an amplifying device, a frequency resonating device, and a limiting device in a series regenerative feedback loop to form a linear oscillator; or by connecting switching elements together with timing networks which turn on and off these switching elements to form a device related to the Eccles-Jordan multivibrator. These circuits generally become complicated and cumbersome when it is desired to produce certain modifications in oscillator behavior with control knobs or by use of modulating signals. This modification of oscillator behavior is required when constructing pulse generators or certain types of telemetering instruments. Adaptive signal conditioning devices sometimes used in instrumentation systems are sometimes required to alter their transfer functions in response to electrical or environmental signals.

It is therefore an object of the present invention to provide an oscillator of relatively simple structure which includes a hysteresis element and a delay element connected in a feedback loop with one or an odd number of phase inversions such that control of frequency, phase, and waveform is more readily accomplished with manual controls or electrical or environmental signals.

It is another object of this invention to provide a relatively simple oscillator having a sinusoidal output and a rectangular output precisely related in frequency and phase.

It is a further object of this invention to provide an oscillator of relatively simple structure having an output signal absolutely synchronized with the output of a higher frequency oscillator, even though both may operate over a considerable range of frequency and duty factor.

It is an additional object of this invention to provide improved electrical hysteresis and delay elements for use in oscillators or signal conditioning apparatus, the transfer functions being conveniently changed by electrical or environmental signals.

Still another object of this invention is to define the transfer functions and logical interconnection of mechanical, electro-mechanical, pneumatic or hydraulic devices to perform similar oscillating or signal conditioning functions.

Other objects and advantages of the invention will be apparent from the following description taken in conjunction with the accompanying drawings.

Figure 1:
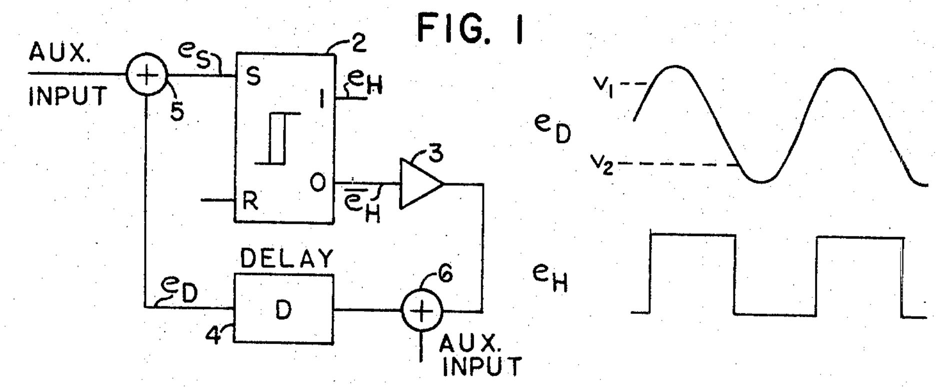
FIGURE 1 is a logic diagram of the oscillator including a hysteresis element and a delay element having resonant energy storage elements.

Referring to the logic diagram shown in FIGURE 1 of the drawings, the oscillator includes a hysteresis element 2, a buffer amplifier 3 if necessary to match signal impedances, and a delay element 4. The voltage waveforms illustrating the operation of the oscillator appear at the right. These waveforms were observed using a delay element comprising an inductor and capacitor in the low pass filter configuration. The transfer function of the hysteresis element can be understood by examination of these waveforms. The cathode coupled binary, or Schmitt circuit discussion given by Millman and Taub in Pulse and Digital Circuits, McGraw-Hill, 1956, pages 164 to 172 may be used for reference.

When the potential at the hysteresis element input $e_s$ reaches threshold $V_1$ the output voltage at terminal 1 rises abruptly from a negative or near zero potential to a more positive potential. The output voltage at terminal 0 of the hysteresis element 2 is the logical inverse or complement of the voltage at the 1 terminal, i.e., the 0 terminal has a low potential when the 1 terminal has high potential, and vice versa. Once the output 1 of the hysteresis element has reached the more positive potential it will remain at this potential regardless of input voltage changes until such time as the input voltage is reduced to the lower magnitude threshold $V_2$ in FIGURE 1. Thereupon the output 1 falls promptly to the more negative potential characteristic of the particular circuit used, and remains at this potential irrespective of input voltage changes until such time as the voltage reaches threshold $V_1$ again. Then the inversion reoccurs.

Oscillations result from the feedback arrangement shown in FIGURE 1. It can be explained as follows. If the hysteresis element 2 is positive, its output has recently exceeded threshold $V_1$, and the 0 output, now low or negative, was previously more positive than $V_1$, and this caused energy to be stored in delay element 4 which acts to maintain the input more positive than $V_2$ for a finite time interval. Since the 0 output is now negative it acts to remove energy from the delay element, and the output voltage of the delay element $e_d$ will diminish after a time interval determined by the signal propagation time delay of this delay element. When the delay output voltage has fallen to threshold $V_2$, the hysteresis element inverts, and the 0 output terminal begins to insert energy into the delay element. Some time later this results in a rising voltage at the delay output, this eventually exceeds $V_2$, and inversion occurs. The process is repetitive, and potential changes occur at regular time intervals.

The LC time delay element used in FIGURE 1 may be replaced by any electrical time delay element. Delay elements comprising an inductor and a resistor, a capacitor and a resistor, a transmission line, a piezoelectric or electro-mechanical filter or related delay devices may also be used if suitable buffer amplifiers are provided as required. One or more of the resistive, reactive or resonating elements forming the delay 4 may be replaced by electrical transducers which exhibit changing resistance or reactance in response to electrical or environmental inputs. Then a frequency, phase, or duty factor modulated oscillator obtains. Such devices are useful in a variety of telemetering applications. Electrical transducers may be constructed using field effect, metal oxide, or junction transistors or diodes. Environmental transducers can be constructed using resistors which change value when subject to mechanical strain or temperature change; or inductors which change value when adjacent to a metal or other conductor; or capacitors which change capacitance when subjected to an applied force or change in temperature.

Since the list of such transducers is practically endless, no effort is made to include all possibilities.

The logical approach of this oscillator is general in that it may use electro-mechanical, pneumatic, hydraulic, or other devices to produce repetitive signals. What is required is a hysteresis element having two relatively stable output states, the one reachable only when the input exceeds a certain high threshold, the other reached only when the input is less than a low threshold; and a delay device whose output response occurs only at a time remote from the input stimulus; and sufficient power gain in the loop to insure that the delay output can repeatedly reach the high and low thresholds, and a polarity inversion. The entire energy input to the delay or hysteresis element need not be derived from the oscillator components. Some may be obtained from auxiliary inputs shown entering the signal adding elements 5 and 6 in FIGURE 1. If the power gain around the loop is somewhat below that needed to sustain oscillations, and power is added at 5 and 6, oscillations will result only when the added signals are of such magnitude and repetition period and phase as to reinforce the hysteresis and delay loop characteristics, provided the input signals are relatively small in magnitude. Then a detector of coherent signals can be made, and this detector will have signal limiting properties. Alternatively, if the loop power gain exceeds unity inputs to 5 and 6 may be used to effect synchronization of the oscillator with the input signals. If networks 5 and 6 are modulators or signal multipliers, the loop oscillator may be keyed or modulated, and the magnitude of the signals at the delay element output modulated in conformance with the input signal source.

Figure 2:
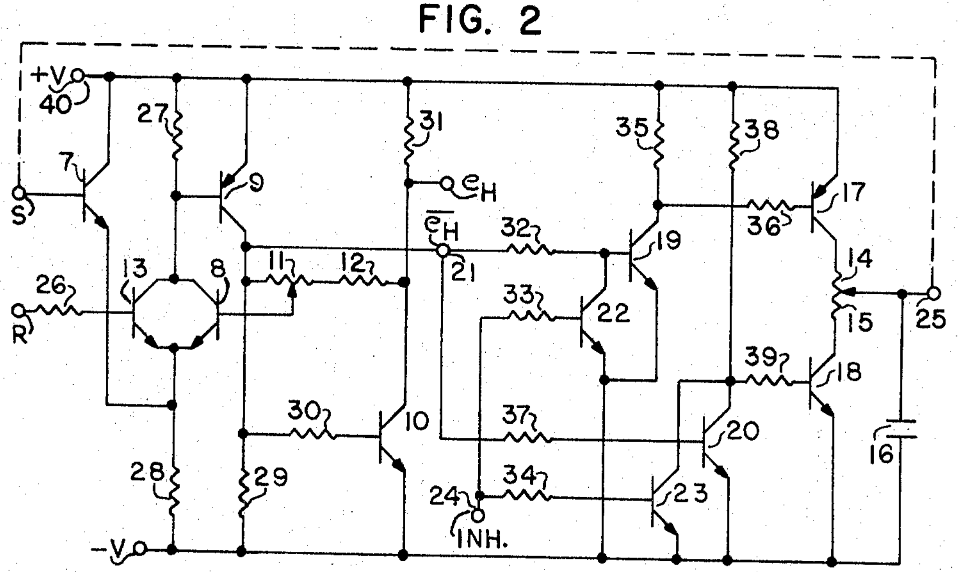
FIGURE 2 is a schematic representation of an electrical circuit which includes the hysteresis and delay functions in a form which is useful in producing electrical pulses.

An electrical oscillator making use of the logic diagram of FIGURE 1 is shown in the schematic diagram FIGURE 2. The hysteresis element is at the left, and the delay element is at the right. The operation of the hysteresis element is described first. The delay description follows. In the absence of transistor 7, transistors 8 and 9 form a bistable element. If transistor 8 conducts current this causes transistor 9 to draw current, and the output of 9 is such as to cause 8 to draw current. Conversely, if one is cut off or drawing little current this causes the other to be cut off. Transistor 7 is able to override the action of transistor 8. If transistor 8 is conducting it can be turned off by a potential on the base of emitter follower transistor 7 exceeding the base potential of transistor 8. This will cause turn off of transistor 9. Conversely, if transistor 8 is turned off, a base potential at transistor 7 which is less than that of 8 will cause 8 to conduct, and 9 will conduct.

Transistor 10 has a collector potential which is the logical inverse of transistor 9. The base of transistor 8 is at a potential representing a fraction that of transistor 9 plus a lesser fraction of that at transistor 10. This fraction is set by hysteresis gap adjust potentiometer 11 and associated resistor 12. If the base voltage or potential of transistor 8 nearly follows the wide variation in voltage of the collector of transistor 9 a similar wide voltage excursion is required at the base of transistor 7 to cause circuit inversion from one state to another, i.e., the separation between voltage thresholds is large. However, if the base voltage of transistor 8 changes but little as the collector of transistor 9 switches states, only a small change in voltage is required at transistor 7 base to cause circuit inversion, i.e., the hysteresis threshold voltages are nearly of the same magnitude. Then the gap adjust potentiometer 11 sets the voltage difference between the inversion threshold potentials $V_1$ and $V_2$ shown in FIGURE 1. Because of the complementary nature of the voltages at the ends of potentiometer 11 and the voltage saturation characteristics of transistors 9 and 10 this threshold gap adjustment is symmetrical about the mean or average of the power supply voltage, so $V_1$ and $V_2$ in FIGURE 1 move near to and farther apart from half the power supply voltage. If equal positive and negative supplies were used the gap adjustment would be symmetrical about ground. This is of real value in building some types of pulse generator and signal conditioning device. Transistor 13 may be added if a reset input is required for purposes of synchronization of other logical function, such as gating or keying of oscillator or hysteresis action. If transistor 13 is driven by an external signal so as to cause it to conduct current then transistor 9 will draw current, and the hysteresis element may be driven into one state promptly, or for an extended period. The transistors 7, 8 and 13 are coupled in the form of a differential amplifier with their respective bases forming three differential amplifier inputs and the output being the common terminal of the connected collectors of transistors 8 and 13 and to which the base of transistor 9 is coupled. The hysteresis element of FIGURE 2 is useful when it is requried to condition an analog signal for use in a digital signal handling system. The output $e_H$ will be in either one of two binary states when an analog input signal is connected to the S input driving the base of transistor 7. Potentiometer 11 provides an adjustment of threshold voltage about the average of the reference voltage.

The gap adjustment potentiometer 11 and associated resistor 12 may be modified by, or replaced by electrical transducers which convert electrical signals to changes in resistance or operating voltage at the base of transistor 8. Field effect or metal oxide transistors or other modulators may be used for this purpose. Then the hysteresis gap may be controlled by applied electrical or environmental signals. Such a device is useful when it is required to build adaptive signal conditioning apparatus.

An electrical delay element is shown in the right half of FIGURE 2. The delay is determined in this case by resistance 14 and 15 and capacitor 16. The upper part of potentiometer 14 is driven by saturating switching transistor 17, and the resistance 15 below the arm of the potentiometer is driven by saturating switch transistor 18. Means are provided so that transistor 17 draws current only when transistor 18 is cut off, i.e., drawing negligible current. Thus transistor 17 acts to charge capacitor 16 through the upper part 14 of the potentiometer. Then the voltage rising time constant is $R_{14}C_{16}$. Means are provided such that transistor 18 conducts only when transistor 17 is cut off. Thus it acts to reduce the potential on capacitor 16 through resistance 15. Then the voltage falling time constant at the delay output is determined by $R_{15}C_{16}$.

It is sometimes required to synchronize oscillations or signals in a manner such that an output transition does not necessarily occur at the instant of a synchronizing signal input transition. To this end the following soft sync. circuit is provided.

In FIGURE 2 transistors 19 and 20 are arranged to drive transistors 17 and 18 as stated above in response to a delay element input signal 21 only when transistors 22 and 23 are not drawing current. Means are provided such that when transistors 22 and 23 do conduct strongly as a result of a positive inhibit signal on input terminal 24 the action of transistors 19 and 20 is negated and no current of any significance is drawn by transistors 17 and 18. Then the inhibit input signal functions to cause capacitor $C_{16}$ to maintain essentially the same voltage as existed when the inhibit signal began, and to do this for the duration of the inhibit signal.

This delay element is useful when it is required to retard a digital signal by a controlled amount. $R_{14}$ and $R_{15}$ may be separate variable resistors. Then independently adjustable delays are obtained for positive going and negative going signals at delay element input 21.

Resistors $R_{14}$ and $R_{15}$ and capacitor $C_{16}$ may be replaced by electrical transducers or modulating elements. Metal oxide or field effect transistors make good resistance modulating elements. The capacitor 16 may be modified or replaced by a PN junction diode charge depletion zone, and modulated by its return potential.

To obtain pulse generator action the delay output 25 is returned to the hysteresis element input S which drives the base of transistor 7. Then oscillations occur in the manner described in connection with FIGURE 1.

The time required for a rising potential at the output 25 to reach hysteresis threshold $V_1$ and cause inversion of outputs $e_H$ and $\overline{e_H}$ is determined by $R_{14}$, $C_{16}$, and the separation between hysteresis thresholds $V_1$ and $V_2$. If $V_1$ is nearly equal to $V_2$ this is short. If $V_1$ and $V_2$ are widely separated this time is relatively long. Then the hysteresis gap adjust potentiometer 11 adjusts oscillator frequency. The relative duration of positive pulse output and negative pulse output, termed duty factor, at terminal $e_H$, is set by the ratio of $R_{14}$ and $R_{15}$. Movement of the arm of potentiometer 14, 15 in general does not alter frequency since the sum of the two time constants for rising and falling voltage at terminal 25 is the same. This neglects certain stray circuit effects that become noticable at extreme settings of potentiometer 14, 15.

To the extent that movement of the arm of potentiometer 11 produces increasing and decreasing voltage thresholds changing symmetrically about the average value of the power supply voltage, and neglecting stray effects that are noticable at extreme settings, potentiometer 11 adjusts frequency but not duty factor. This is desirable in some pulse generators.

I have constructed hysteresis and delay elements which operate as an improved pulse generator or function as improved signal conditioning units using the circuit values shown below. A great variety of other values may be used instead, so the invention is not restricted to these values. Transistors 7, 8, 10, 18, 19, 20, 22, and 23 are type 2N2257. Transistors 9 and 17 are type 2N3638. Capacitor 16 may be any value between about 0.001 and over 100 microfarads. Resistors 11, 12, 26, 27, 32, 33, 34, and 37 are 5000 ohms. Potentiometer 14, 15 is 10,000 ohms. Resistors 29, 31, are 500 ohms, and resistors 30, 35, 36, 38, and 39 are 2000 ohms. Power supply voltage 40 is +5 volts. In summary, the circuit of FIGURE 2 makes use of the functions shown in FIGURE 1 to produce a pulse generator wherein essentially independent adjustment of frequency and duty factor is achieved. In addition, the hysteresis and delay elements are improved signal conditioners.

It is sometimes desired to obtain absolute synchronization between a relatively high frequency signal or clock and a lower frequency oscillator, even when either or both are varied over wide limits in frequency and duty factor. This is achieved in improved form using the logic diagram shown in FIGURE 3.

Figure 3:
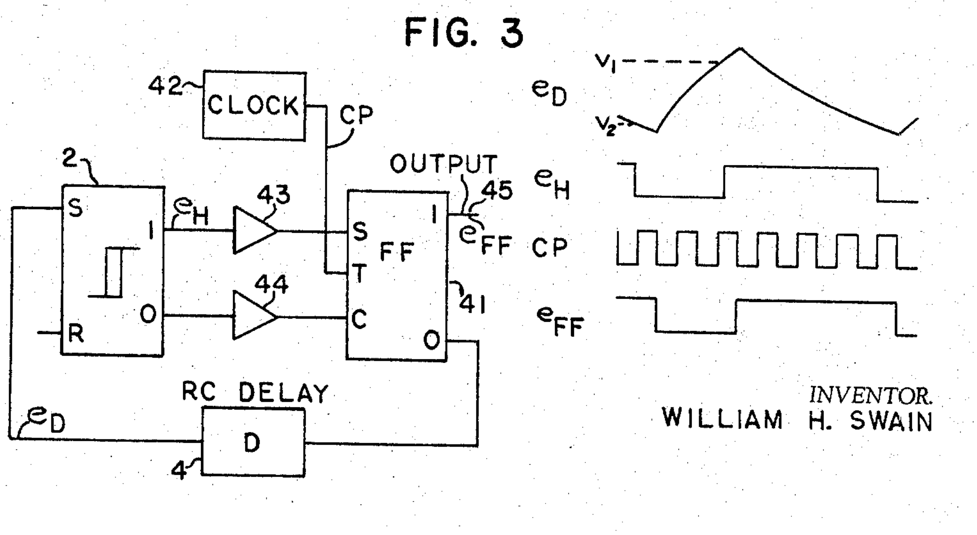
FIGURE 3 is a logic diagram of an electrical oscillator wherein the change of polarity of the oscillator output can only occur at the instant of change of polarity of a higher frequency electrical clock oscillator.

A shift register type flip flop 41, sometimes referred to as the Eccles-Jordan circuit, is inserted in series with the hysteresis element 2 and delay element 4 as shown in FIGURE 3. The shift register flip-flop, termed FF for brevity, is of the type which can change state only when a specified polarity transition occurs at the output of an external clock connected to the toggle input T of FF41. One such FF is described more fully in Fairchild Semiconductor Corp. publication Fan Out, number 116, February 1964, by Mr. W. O. Hamlin, editor. In the present case the clock 42 drives FF41 which is of a type which toggles only on a negative transition at toggle input T. The Fairchild type 92329 micrologic element has been used successfully.

The steering inputs S and C of FF41 are driven by the complementary outputs 1 and 0 of hysteresis element 2. Buffer amplifiers 43 and 44 are used if necessary for impedance matching. Thus if hysteresis element 2 is in the state with the 1 output positive and the 0 output low or negative the FF41 will go to the set state with its 1 output positive and its 0 output low, from the opposite reset state, only when a negative clock transition occurs. The inverse FF transition likewise occurs with inverse steering only when a negative clock transition occurs. The voltages $e_H$, CP, and $e_{FF}$ have, in general, a greater magnitude swing than voltage $e_D$, which is magnified in FIGURE 3 for clarity.

It will now be seen that the arrangement of FIGURE 3 provides an output voltage 45 which can change logical state, i.e., change from positive to negative, or from negative to positive, only when the clock 42 goes from positive to negative. This results from the fact that the hysteresis element 2 steers the FF41 to change state from negative to positive when the output of the delay 4 has exceeded the threshold $V_1$ of hysteresis element 2, but change occurs when clock 42 has a negative transition. Likewise, Negative hysteresis transition and negative steering exist at $e_H$ when the output voltage of the delay 4, $e_D$, has fallen below threshold $V_2$, but FF41 transition occurs only on negative clock transition.

I have observed that solid synchronization may be maintained even though both clock 42 and low frequency determining units hysteresis 2 and delay 4 change over a wide range of duty factor and frequency. The performance of this synchronizer is considerably improved over that of related devices currently used.

It will be observed that all elements of FIGURE 3 may be replaced by electro-mechanical, pneumatic or hydraulic devices having the same generic transfer functions, and similar results obtained. Many varieties of electrical hysteresis, delay, clock, and FF can be designed. However, when arranged in a feedback loop generally as shown in FIGURE 3 the same or similar results will be obtained. The clock need not be periodic. A periodic or manually operated clock sources may be used. The line between delay 4 output and hysteresis 2 input may be keyed manually, or gated electrically or by environmental transducers. Still, the FF41 output 45 will exhibit synchronization.

What is claimed is:

1. In an oscillating device, a hysteresis element having an output in either one of two binary states, one state being induced by an input signal that must exceed a threshold and the other being induced by a signal that must be below another threshold, the two thresholds being separated by a finite difference; an LC delay element having a signal response output which occurs some finite time after an input signal stimulus; means for coupling said elements together in series in a feedback loop, means coupled in said loop for providing sufficient signal magnitude gain around the loop such that the delay element signal response output causes said hysteresis element input signals to respectively exceed and be below said thresholds; and means for causing signal inversion at an odd number of points in the loop.

2. In an electrical oscillator, an electrical hysteresis element and an inductive type electric signal delay element coupled together in a series feedback loop with means in said loop for achieving impedance match between said elements, means coupled in said loop for effecting power gain sufficient to provide a response signal magnitude exceeding the magnitude of a stimulus signal if the loop is opened, and means for causing an odd number of signal inversions in the loop.

3. In an electrical oscillator, a hysteresis element including solid state amplifying and switching components arranged for operation as an electrical hysteresis element with power gain, inductive type electrical energy storage means arranged for operation as a time delay element to delay tansmission of an electrical signal, and signal inverting means, all of said elements and means arranged in a series feedback loop so that oscillations occur.

4. In an electrical hysteresis element having an upper and lower thresholds, means for causing two oppositely phased sources of an electric signal, a potentiometer connected across said oppositely phased sources and having an adjustable arm, a differential amplifier having at least two inputs with the adjustable arm of the potentiometer being connected to one of the two inputs of said differential amplifier, the other input being the hysteresis element threshold input, said hysteresis element being responsive at said threshold input to signal potentials above said upper threshold and below said lower threshold values of said means and potentiometer being chosen such that variation of the potentiometer arm position results in a variation of said upper and lower threshold potentials symmetrically about a reference value.

5. In an electrical hysteresis element having an upper and lower thresholds, a differential amplifier means having at least two inputs, means for causing two oppositely phased sources of an electric signal, resistor means coupled across said oppositely phased sources and to one of said two inputs of said differential amplifier means, the other of said two inputs being a hysteresis element threshold input, said hysteresis element being responsive at said threshold input to signal potentials above said upper threshold and below said lower threshold, the values of said means being such that variations of said resistor means result in corresponding variations in said upper and lower thresholds.

6. In an electrical oscillator, a hysteresis element including solid state amplifying and switching components arranged for operation as an electrical hysteresis element with power gain and with a differential amplifier configuration having an output and at least two inputs with said two inputs being for operation at opposite polarities, two oppositely phased signal sources in driven relation to said differential amplifier output, resistor means coupled across said oppositely phased signal sources and means coupling said resistor means to one of said differential amplifier inputs for effecting at said differential amplifier input a signal having the same sense and a magnitude greater than the signal required at said input for creating said signal potential in said coupling means; electrical energy storage means arranged for operation as a time delay element to delay transmission of an electrical signal; and signal inverting means; all of said elements and means arranged in a series feedback loop so that oscillations occur.

7. In an electrical delay element, a capacitor having two sides with one side connected to the arm of a potentiometer one end of which is driven positive in potential at some instants of time by a solid state switching device, the other end of which is driven negative at other instants of time by another solid state switching device, the other side of said capacitor coupled to one of said switching devices and means having an input terminal for driving said switching devices as stated when an appropriate potential is applied to said input terminal, the whole functioning to cause the capacitor voltage selectively to increase and decrease as time passes and as commanded by the said input terminal potential, the rate of change in capacitor potential being determined by the potentiometer resistance, the capacitor's capacitance, and the position of the potentiometer arm, so that the total time constant of the rising and falling capacitor voltage is invariant with changes in potentiometer arm position; the capacitor voltage being the delay element output.

8. In a delay element capacitive energy storage means having two sides, a source of negative potential, a source of positive potential, resistor means coupled across said sources of potential and to one side of said capacitive energy storage means, the other side of said capacitive energy storage means being coupled to one of said potential sources, a first switching means interposed in the coupling of said resistor means to source of negative potential, a second switching means interposed in the coupling of said source of positive potential, and control means responsive to control potentials for controlling said switching means.

9. In an electrical oscillator, a hysteresis element including solid state amplifying and switching components arranged for operation as an electrical hysteresis element with power gain; electrical energy storage means arranged for operation as a time delay element to delay tansmission of an electrical signal, said storage means including a capacitor having two sides, a source of constant negative potential, a source of constant positive potential, resistor means having two ends, means of adjustably coupling said resistor means to one side of said capacitor, means for coupling the other side of said capacitor to one of said sources of constant potential, switching means coupled to one end of said resistor means and one of said sources of constant potential, and a second switching means coupled to the other end of said resistor means and the other source of constant potential; and signal inverting means; all of said elements and means arranged in a series feedback loop so that oscillations occur.

10. In an electrical oscillator, a hysteresis element including solid state amplifying and switching components arranged for operation as an electrical hysteresis element with power gain, said hysteresis element being responsive to an upper and lower threshold potentials and including two oppositely phased electric signal sources, resistor means coupled across said oppositely phased signal sources, amplifier means in driving relation to said signal sources and having two inputs and an output, one input being coupled to said resistor means and the other input being the hysteresis threshold input; electrical energy storage means arranged for operation as a time delay element to delay transmission of an electrical signal, said delay element electrical energy storage means including a capacitor having two sides, a source of negative potential, a source of positive potential, resistor means coupled across said sources of potential and to one side of said capacitor, the other side of said capacitor being coupled to one of said potential sources, switching means interposed in each said coupling of said resistor means to said sources of potential, and control means coupled in responsive relation to said amplifier means output and in control relation to said last mentioned switching means; and signal inverting means; all of said elements and means arranged in a series feedback loop with said one side of said capacitor and said threshold input being coupled in said feedback loop so that oscillations occur.

11. In an electrical hysteresis element as claimed in claim 5 having additionally means including a third input to said differential amplifier for causing the hysteresis element to be instantly shifted from an electrical state corresponding to that effected by a positive input potential at said threshold input exceeding said upper threshold potential to the opposite state corresponding to that effected by an input potential at said threshold input below the lower threshold potential when said third input is energized regardless of the potential of the hysteresis element threshold input, whereby if said threshold input be termed a set input, said third input is properly termed an overriding reset input.

12. In an electrical oscillator, a hysteresis element including solid state amplifying and switching components arranged for operation as an electrical hysteresis element with power gain, said hysteresis element including an upper and lower threshold potential input means for effecting a set electrical state in response to an input potential exceeding said upper threshold potential and a reset electrical state in response to an input potential lower than said lower threshold; electrical energy storage means arranged for operation as a time delay element to delay transmission of an electrical signal; and signal inverting means; all of said elements and means arranged in a series feedback loop so that oscillations occur; and an overriding potential input means for causing said hysteresis element to effect said reset electrical state regardless of the potential at said threshold potential input means.

13. In an electrical delay element as claimed in claim 7 having additional means including an inhibit input responsive to an inhibit potential for causing said switching devices which normally act to cause the capacitor voltage to selectively increase and decrease to become substantially nonconductive, whereby said capacitor potential tends to remain at a relatively constant magnitude for a considerably extended period of time.

14. In an electrical oscillator as claimed in claim 3 wherein said electrical delay element includes inhibit means responsive to an inhibit signal for causing said oscillations to cease during the presence of said inhibit signal at said inhibit means.

15. In an electrical signal path, an electrical hysteresis element having a threshold signal input in said path and a pair of outputs for output signals of opposed polarity; a shift register type flip-flop having a pair of steering inputs, a toggle input and a pair of output terminals with said steering inputs coupled in driven relation to the outputs of the hysteresis element; signal delay means coupled to one of said flip-flop outputs and said threshold signal input; and a clock having an output for carrying electrical state inversions coupled to the toggle input of the shift register flip-flop; whereby a threshold input signal change causing a hysteresis element output signal change does not effect a signal change at the other flip-flop output until a transition in electrical state occurs at the clock output in the sense dictated by the flip-flop design.

16. In an electrical oscillator, a hysteresis element including solid state amplifying and switching components arranged for operation as an electrical hysteresis element with power gain; a shift register type flip-flop, said flip-flop having a pair of steering inputs coupled in responsive relation to said hysteresis element, a toggle input and a pair of output terminals; electrical energy storage means arranged for operation as a time delay element to delay transmission of an electrical signal, said delay element being coupled to one of said flip-flop output terminals; and signal inverting means; all of said elements and means arranged in a series feedback loop so that oscillations occur; and synchronizing signal means having an output coupled to said toggle input for synchronizing said flip-flop output to said delay element with said synchronizing signals.

17. In an electrical oscillator, a hysteresis element including solid state switching components arranged for operation as an electrical hysteresis element; electrical energy storage means arranged for operation as a time delay element to delay transmission of an electric signal, signal inverting means, all of said elements and means arranged in a series feedback loop for said electric signal, and means coupled to said loop for reinforcing said electric signal in said loop sufficiently for oscillations to occur.

References Cited

UNITED STATES PATENTS

| | | | |
|---|---|---|---|
| 2,997,665 | 8/1961 | Sylvan | 331—143 X |
| 3,122,652 | 2/1964 | Kobbe et al. | 331—111 X |
| 3,156,875 | 11/1964 | Fiorino et al. | 331—111 |

ROY LAKE, *Primary Examiner.*

NATHAN KAUFMAN, S. H. GRIMM, *Examiners.*